United States Patent [19]

Berger

[11] 4,293,832
[45] Oct. 6, 1981

[54] TRANSVERSAL CHARGE TRANSFER FILTER

[75] Inventor: Jean L. Berger, Paris, France
[73] Assignee: Thomson-CSF, Paris, France
[21] Appl. No.: 136,375
[22] Filed: Apr. 1, 1980
[30] Foreign Application Priority Data
  Apr. 6, 1979 [FR] France ................... 79 08789
[51] Int. Cl.³ .................. H03H 15/02; H03H 17/02; G11C 19/28
[52] U.S. Cl. ........................ 333/165; 307/221 D; 333/166
[58] Field of Search ............... 333/165, 166, 173; 357/24; 307/221 R, 221 C, 221 D, 303, 304, 295; 364/824–827, 862; 328/165, 167

[56] References Cited

U.S. PATENT DOCUMENTS 3,819,958  6/1974  Gosney ..................... 333/165 X
4,156,858  5/1979  Weckler et al. .............. 333/165

*Primary Examiner*—Marvin L. Nussbaum
*Attorney, Agent, or Firm*—Roland Plottel

[57] ABSTRACT

One storage electrode of the filter out of two is cut into two parts. The weighting coefficients are elaborated by reading means connected to a part of each cut storage electrode which read negatively the charges leaving a so-called negative cut storage electrode and positively the charges arriving under the next so-called positive cut storage electrode.

6 Claims, 11 Drawing Figures

FIG_1
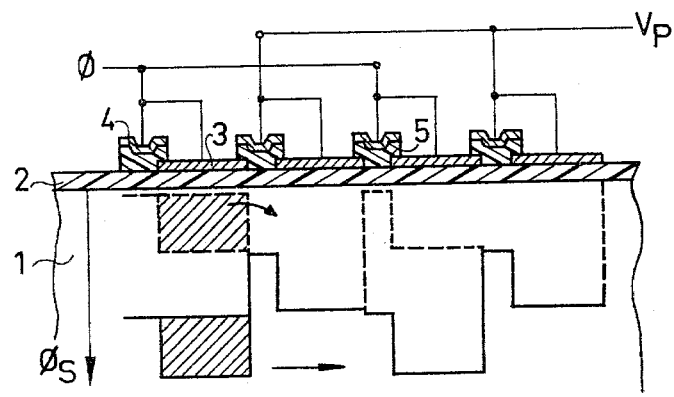
FIG_3
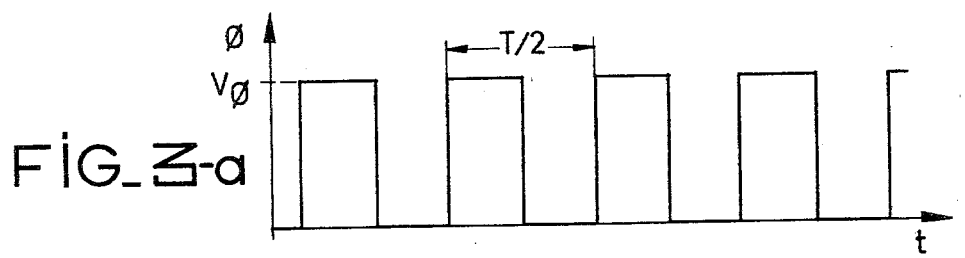
FIG_3-a
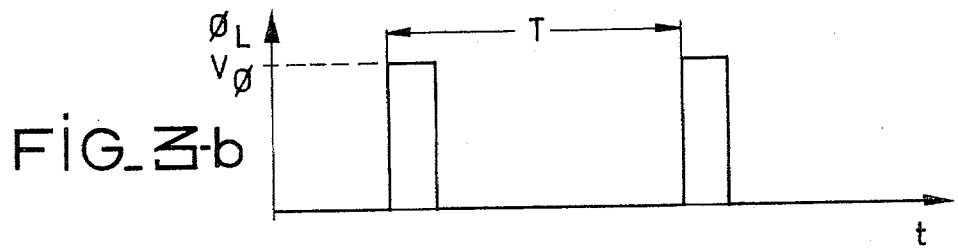
FIG_3-b
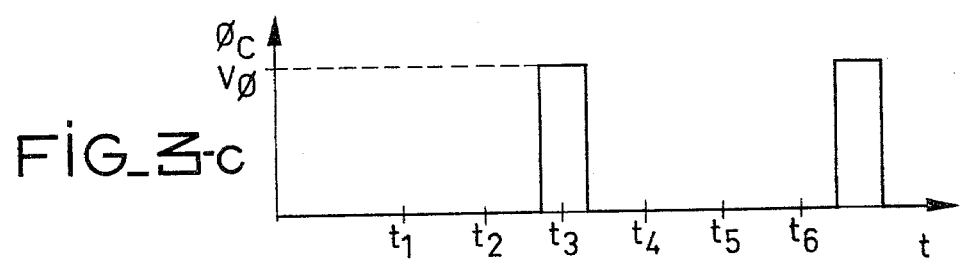
FIG_3-c

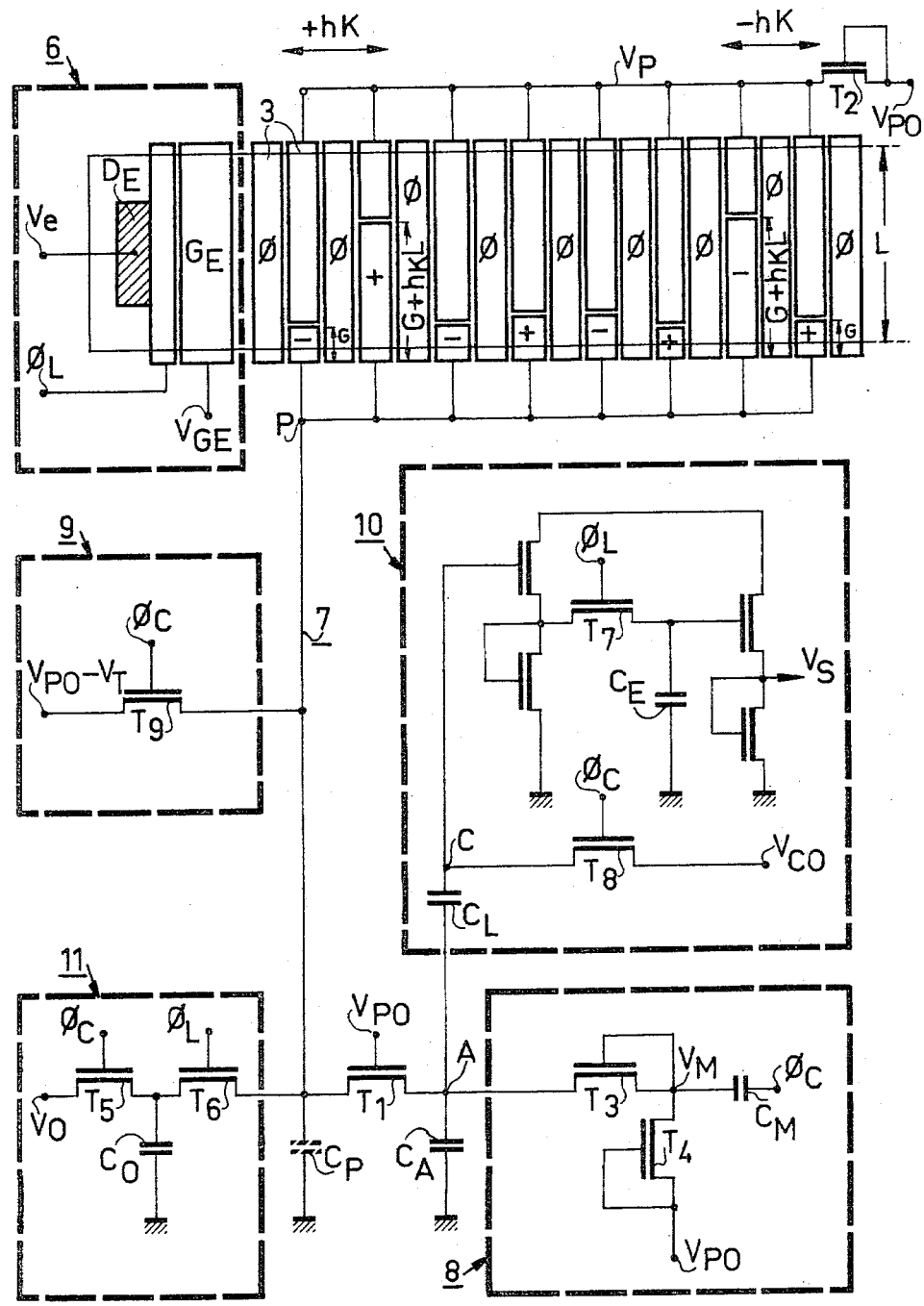

FIG_4
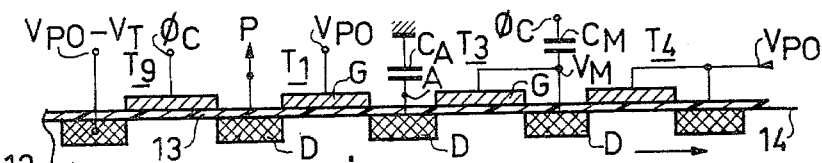
FIG_4-a
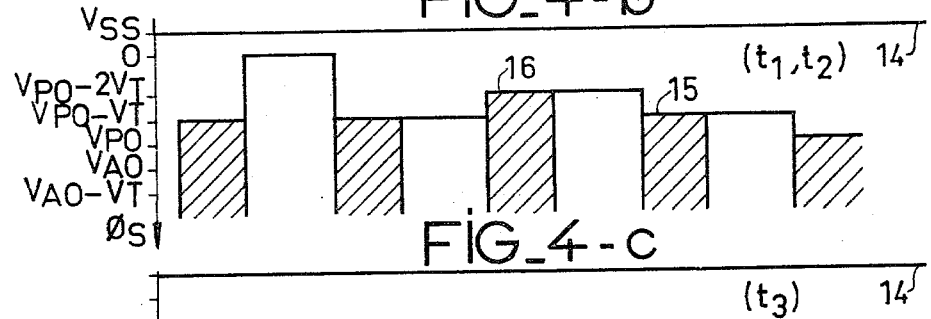
FIG_4-b
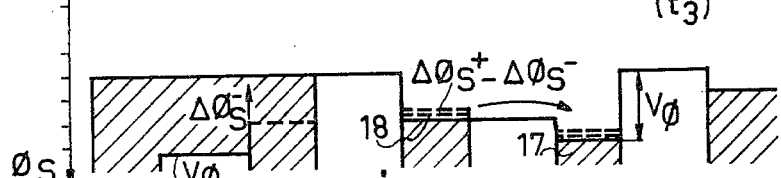
FIG_4-c
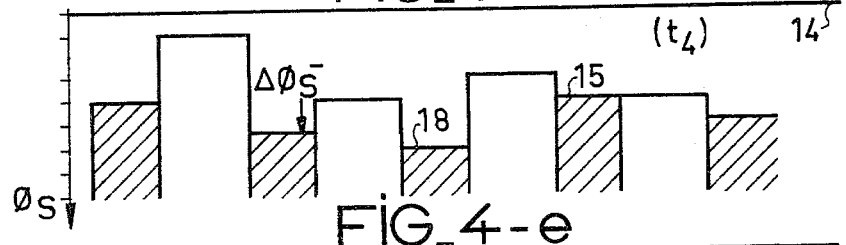
FIG_4-d
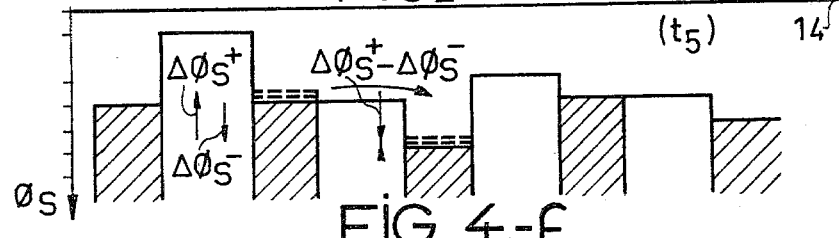
FIG_4-e
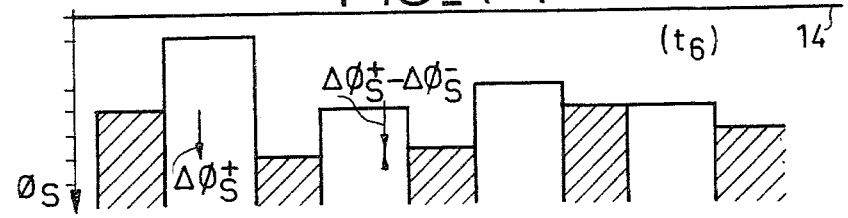
FIG_4-f

TRANSVERSAL CHARGE TRANSFER FILTER

BACKGROUND OF THE INVENTION

The present invention relates to a transversal electric charge transfer filter with cut electrodes.

It will be recalled that a transversal cut electrode filter is generally formed by a semiconductor substrate covered by an insulating layer on which are alternated transfer electrodes and charge-storing electrodes, periodically receiving given potentials. These electrodes are disposed parallel to each other and transversely in relation to the charge transfer direction. The storage electrodes are cut transversely, generally in two parts, and the quantities of charges under the two parts of each storage electrode are read differentially so as to achieve weighting of the signal to be filtered.

The article by Richard D. Baertsch et al, entitled "The design and operation of practical charge—transfer transversal filters", and appearing in the IEEE review Transactions on Electron Devices, volume ED-23, number 2, of February 1976, pages 133 to 142, deals with transversal cut electrode filters and with the problems which they pose; among these problems, there may be mentioned:

the need to carry out a reading of the differential charges so as to obtain positive and negative weighting coefficients; this differential reading is conventionally achieved by means of an external differential amplifier, which has the disadvantage of being cumbersome, or by means of a differential amplifier integrated on the same substrate as the filter itself and formed essentially of MOS transistors, which has the disadvantages of a much greater consumption than that of charge-transfer devices and the non-linearities likely to be introduced by the MOS transistors;

the high common mode during elaboration of weighting coefficients close to zero, which tends to cause saturation of the differential amplifier and which in any case reduces its signal to noise ratio for the differential signal diminishes without the capacity of the storage electrodes diminishing;

the disturbance of the reading of the charges under the storage electrodes by control signals applied to the different electrodes;

the high number of control signals.

SUMMARY OF THE INVENTION

The present invention relates to a transversal electric charge transfer filter in which one storage electrode out of two is cut into two parts and in which the weighting coefficients are elaborated by reading means connected at a point P to a part of each cut storage electrode and which read negatively the charges leaving a so-called negative cut storage electrode, and positively the charges arriving under the next so-called positive cut storage electrode. The transfer electrode—cut storage electrode pairs receive a substantially constant potential $V_P$ and the the transfer electrode—whole storage electrode pairs receive a periodic signal, of a period equal to half of the period for injecting charges in the filter, which ensures at a given moment the presence of charges under one cut storage electrode out of two of the filter.

The transversal cut electrode filter of the invention presents numerous advantages amongst which may be mentioned:

the differential reading of the charges carried out directly without differential amplifier;

the reduction of the common mode to the minimum width of the channel of the charge-transfer device for obtaining a charge transfer in good conditions;

the removal of the disturbance caused in the reading of the charges under the storage electrodes by control signals applied to the different electrodes;

the number of control signals reduced to three.

The above and other objects, features and advantages of the present invention will become apparent from the following description, given solely by way of non-limiting illustration, when taken in conjunction with the accompanying drawings.

DESCRIPTION OF THE DRAWINGS

FIG. 1 is a diagram showing the operation of the filter of the invention.

FIG. 2 shows one embodiment of the filter of the invention.

FIGS. 3a, b, c, are diagrams of signals which may be applied to the filter of the invention.

FIGS. 4a to 4f are diagrams showing the operation of the filter of the invention.

In the different figures, the same reference numbers designate the same elements but, for the sake of clarity, the sizes and proportions of the different elements have been respected.

DESCRIPTION OF THE PREFERRED EMBODIMENTS

FIG. 1 shows a diagram illustrating the operation of the invention.

The filter in accordance with the invention which is shown, seen in cross-section, along the direction of propagation of the charges shown by an arrow, comprises a semiconductor substrate 1, made from type P silicon in the example, covered by an insulating layer 2, made from silicon oxide in the example. On this insulating layer 2 are deposited charge-storing electrodes 3, substantially normal to the direction of propagation of the charges. Charge-transfer electrodes 4 alternate with the storage electrodes. The transfer electrodes 4 are deposited on a thickened portion 5 of the insulating layer.

As is known, this arrangement has a dual purpose, on the one hand to ensure continuity of the potentials created in the semiconductor 1 and, on the other hand, to impose a single transfer direction for the charge carriers.

This structure comprising a thickened portion of the insulating layer may be replaced by overdoping of the substrate, by implantation of ions, fulfilling the same functions.

The filter of the invention operates in monophase. One storage electrode out of two is cut into two parts. The transfer electrode—whole storage electrode pairs receive a periodic signal $\phi$. The transfer electrode—cut storage electrode pairs receive a constant potential $V_P$.

There is also shown in FIG. 1 the surface potential $\phi_S$ under the transfer electrode—storage electrode pairs. The surface potential steps under the electrode pairs driven by the periodic signal $\phi$ are at times greater than those which are under the electrode pairs driven by the constant potential $V_P$ (in this case, the charges are under the storage electrodes driven by $\phi$) and sometimes less and shown with a broken line in the figure (in this case, the charges are transferred under the storage electrodes driven by $V_P$).

The curves showing the variations of the surface potential under the transfer and storage electrodes depending on the voltage applied to these electrodes must be substantially parallel for the storage capacity to be constant for the electrode pairs driven by $\phi$ and by $V_P$. It is possible to adjust the thresholds under the transfer and storage electrodes by implantation.

FIG. 2 shows one embodiment of the filter of the invention. In FIG. 2, the transfer electrodes are not shown and only the storage electrodes, alternately whole and driven by $\phi$ and cut into two parts and driven by $V_P$ are shown seen from above.

The filter of the invention comprises a device 6 for injecting conventional charges, formed by an input diode $D_E$ which receives the input signal to be filtered $V_e$, followed by a sampling grid driven by a periodic signal $\phi_L$ and a storage grid $G_E$ maintained at a fixed voltage $V_{GE}$.

The frequency of the periodic signal $\phi_L$ applied to the sampling grid is equal to half that of the periodic signal $\phi$ which ensures the transfer of charges in the filter. The position of signals $\phi$ and $\phi_L$ in relation to each other is such that the signal charges are only present at a given moment under one cut storage electrode out of two of the filter.

The weighting coefficients of the filter are elaborated by reading means 7 connected at a point P to a part of each cut storage electrode and which impose the constant potential $V_P$. The parts of these cut storage electrodes under which charges are not read are also brought up to the constant potential $V_P$, in the example, by means of an MOS transistor $T_2$, connected to a constant potential $V_{PO}$ which is such that $V_P = V_{PO} - V_T$, $V_T$ being the threshold voltage of the MOS transistor $T_2$ whose grid is also connected to the constant potential $V_{PO}$.

The reading means 7 read negatively the charges leaving a so-called negative cut storage electrode and positively the charges arriving under the next so-called positive cut storage electrode. Two cut weighting electrodes are then necessary for elaborating a weighting coefficient and the filter of the invention comprises therefore a number of stages double the number of coefficients.

For elaborating a weighting coefficient value $+h_K$, a length G must be given to the part of a negative storage electrode under which the charges are read (it is designated by the sign $-$ in the figure), and a length $G + h_K.L$ must be given to the part of the next positive storage electrode under which the charges are read (it is designated by the sign $+$ in the figure), G being the minimum width of the channel CCD for obtaining a charge transfer in good conditions and L being the width of channel CCD.

To obtain a weighting coefficient of value $-h_K$, a length $G + h_K.L$ must conversely be given to an electrode designated by the sign $-$ in FIG. 2 and a length G to the following electrode designated by the sign $+$.

The filter of the invention allows then the common mode to be reduced to the minimum width of the channel of the charge-transfer device for obtaining a charge transfer in good conditions, which improves the reading accuracy of small weighting coefficients.

In the embodiment shown in FIG. 2, the reading means 7 comprise a first MOS transistor $T_1$ connected between point P and a point A. Transistor $T_1$ receives on its grid a constant potential $V_{PO}$ such that the potential at point P equals: $V_P = V_{PO} - V_T$, $V_T$ being the threshold voltage of transistor $T_1$. Between point A and ground is connected a reading capacitor $C_A$.

To point A is connected a circuit 8 which allows the charging of the reading capacitor $C_A$ to potential $V_{AO}$ and removal of the charges which, in transistor $T_1$, represent the elaborated weighting coefficients. This circuit 8 comprises an MOS transistor $T_3$ between point A and point $V_M$, the grid of $T_3$ being connected to $V_M$. To point $V_M$ there are connected a capacitor $C_M$ receiving a periodic signal $\phi_C$ and an MOS transistor $T_4$ which receives the constant potential $V_{PO}$, the grid of $T_4$ being also connected to $V_{PO}$.

To point P is connected an MOS transistor $T_9$ which charges point P to potential $V_{PO} - V_T$ at the moment when signal charges arrive under the negative storage electrodes. Transistor $T_9$ operates as a triode, it is connected to potential $V_{PO} - V_T$ and receives on its grid the periodic signal $\phi_C$.

To point A there is also connected an output circuit 10 which delivers the output voltage of filter $V_S$. Circuit 10 comprises a connecting capacitor $C_L$ between point A and a point C. An MOS transistor $T_8$ is connected between point C and a constant potential $V_{CO}$. To point C there is also connected a first follower stage, followed by an MOS transistor $T_7$, driven by the periodic signal $\phi_L$, followed by a capacitor $C_E$ between one of the terminals of $T_7$ and ground followed finally by a second follower stage which delivers the output signal of filter $V_S$.

In the case where the sum of the weighting coefficients of the filter is negative, a circuit 11 is connected to point P. This circuit 11 is formed from two MOS transistors $T_6$ and $T_5$ in series, receiving at their grids the periodic signals $\phi_L$ and $\phi_C$. One of the terminals of $T_5$ is brought to a constant potential $V_O$. A capacitor $C_O$ is connected between the common point of $T_5$ and $T_6$ and ground.

FIGS. 4a to 4f illustrate the operation of the filter of the invention.

In FIG. 4a there is shown, seen in cross-section along the charge-transfer direction shown by an arrow, a semiconductor substrate 12, covered by an insulating layer 13, in which are integrated the four MOS transistors $T_9$, $T_1$, $T_3$, $T_4$ of the reading means 7 shown in FIG. 2. The unit formed by the charge-transfer device and reading means 7 is generally integrated on the same semiconductor substrate.

Transistors $T_9$, $T_1$, $T_3$, $T_4$ are formed by two diodes D implanted in substrate 12 and a control grid G deposited on the insulating layer 13 between the two diodes.

FIGS. 4b to 4f show the development of the surface potential $\phi_S$ under transistors $T_9$, $T_1$, $T_3$, $T_4$ with time. There is only shown in these figures the interface 14 of substrate 12 and insulating layer 13.

In these figures, the hatched zones represent the minority carriers.

FIGS. 3a, b and c show diagrams for signals $\phi$, $\phi_L$, $\phi_C$ which may be applied to the filter of the invention.

The periodic signal $\phi$ has a period T/2 which is half that of the periodic signals $\phi_L$ and $\phi_C$. These signals vary between a low level and a high level $V_\phi$. The signals $\phi_L$ and $\phi_C$ are preferably identical but out of phase. Signals $\phi_L$ and $\phi_C$ are at the high level when signal $\phi$ is at the low level. Signals $\phi_L$ and $\phi_C$ are staggered by T/2.

The operation of the filter of the invention shown in FIG. 2 is the following:

at time $t_1$, $\phi_L$ is at the high level and equals $V_\phi$. A quantity of charges is injected under the input grid $G_E$, establishing a surface potential under $G_E$ equal to the signal voltage $V_e$. Signal $\phi_C$ is at low level, point $V_M$ is then at potential $V_{PO}-V_T$ through transistor $T_4$. Point A is brought to the potential $V_{PO}-2V_T$ by transistor $T_3$. The level of the surface potential at points $V_M$ and A, at times $t_1$ and $t_2$, is shown by the lines 15 and 16 in FIG. 4b.

At time $t_2$, signal $\phi$ goes to the high level. The quantity of charges injected under grid $G_E$ at time $t_1$ is then transferred under the first whole storage electrode driven by signal $\phi$. The surface potential at points A and $V_M$ is the same as at time $t_1$.

At time $t_3$, signal $\phi$ is at low level. The charges are then transferred under the first cut storage electrode which must read the charges negatively, when they leave this electrode. At time $t_3$, signal $\phi_C$ is at the high level. With $\phi_C$ going to the high level transistor $T_9$ is conductor and operates as a triode and imposes the potential $V_{PO}-V_T$ at point P.

With $\phi_C$ going to the high level the surface potential at point $V_M$ is brought to $V_{PO}-V_T+V_\phi$ (line 17 in FIG. 4c). The surface potential at point A then passes, because of transistor $T_3$, to potential $V_{AO}$ such that:

$V_{AO}=V_{PO}-2V_T+V_\phi$ (line 18 in FIG. 4c) which is much greater than $V_{PO}-V_T$.

Since the potential $V_{AO}$ is greater than $V_{PO}-V_T$, transistor $T_1$ is then saturation-biased. If the potential $V_{PO}-V_T$ imposed by $T_9$ at point P is slightly greater than the potential $V_{PO}-V_T$ under the grid of $T_1$, the excess of charges is removed by $T_1$.

The arrival of charges under negative storage electrodes induces by influence a decrease of potential $\Delta\phi_S^-$ at point P, immediately compensated for by transistor $T_9$.

Since signal $\phi_C$ is at the high level, transistor $T_8$ conducts and charges the connecting capacitor $C_L$ to the value $V_{AO}-V_{CO}$.

At time $t_4$, the signal $\phi_C$ comes back to zero. The potential of point $V_M$ assumes the value $V_{PO}-V_T$ (line 15 in FIG. 4d).

Transistor $T_3$ is then disabled and the isolated point A remains at potential $V_{AO}$ (line 18). Also at time $t_4$, signal $\phi$ is at the high level and transfers the signal charges under the whole storage electrodes. The departure of the charges from the negative cut storage electrodes induces at point P an increase in potential $\Delta\phi_S^-$ which disables $T_1$ and which is such that the potential at point P can be written:

$V_P(t_4) = V_{PO} - V_T + \Delta\phi_S^-$ with $$\Delta\phi_S^- = \frac{NG}{C_P} \cdot \sum_{k=1}^{N} Q_e(t-kT) + \sum_{k=1}^{N} h_k^- \cdot \frac{Q_e(t-kT)}{C_P} = \frac{Q^-}{C_P},$$

in which N is the number of weighting coefficients of the filter, G the minimum width of channel CCD previously defined, $Q_e(t)$ the charges injected at the input of the filter under the sampling grid $G_E$, T the period of injection of charges in the filter and $h_K^-$ the negative coefficients.

At time $t_5$ (see FIG. 4e), the signal $\phi$ is at the low level and the signal charges are transferred under the positive storage electrodes. This arrival of charges induces at point P an instantaneous lowering of potential $\Delta\phi_S^+$ which enables transistor $T_1$, if the sum of the coefficients $$\sum_{1}^{N} (h_K^+ - h_K^-)$$

is positive. With transistor $T_1$ again conducting it imposes at point P the voltage $V_{PO}-V_T$ and removes at point A the excess of charges $(Q^+-Q^-)$ such that:

$Q^+ - Q^- = C_P(\Delta\phi_S^+ - \Delta\phi_S^-)$ with $\Delta\phi_S^+ = \frac{NG}{C_P} \sum_{k=1}^{N} Q_e(t-kT) +$ $$\sum_{k=1}^{N} h_k^+ \cdot \frac{Q_e(t-kT)}{C_P} = \frac{Q^+}{C_P}$$

$h_K^+$ being the positive coefficients.

From which: $Q^+ = Q^- - \sum_{k=1}^{N} (h_k^+ - h_k^-) \cdot Q_e(t-kT)$

The arrival of the quantity charges $Q^+-Q^-$ at point A causes a lowering of potential $\Delta V_A$ equal to $V_A - V_{AO}$ which represents the weighting coefficients of the filter. The potential at point A may be written:

$$V_A = V_{AO} - \frac{Q^+ - Q^-}{C_A}.$$

The capacitor $C_L$ connected to point A keeps its charge $C_L \cdot (V_{AO}-V_{CO})$. The potential of point C behind capacitor $C_L$ undergoes the same lowering as point A. The intermediate stage formed by capacitor $C_L$ and transistor $T_8$ between points A and C prevents the followers from being saturated by the high potential of transistor $T_3$.

Also at time $t_5$, signal $\phi_L$ is at the high level. Transistor $T_7$ is then enabled and takes the potential variation from point C which will be maintained on capacitor $C_E$ until the next charge injection period.

At time $t_6$ (see FIG. 4f), the signal $\phi$ is at the high level and the signal charges are removed from the positive storage electrodes. The potential of point P undergoes by influence an increase $\Delta\phi_S^+$ which again disables transistor $T_1$.

In permanent operation, the times $t_5$ and $t_6$ merge with times $t_1$ and $t_2$ for which the charge injection has been described. The amount of charge $(Q^+-Q^-)$ transferred to point A at time $t_5$ is then removed at time $t_3$ by transistor $T_3$ which discharges the capacitor $C_M$, whereas point P assumes again the value $V_{PO}-V_T$. It is assumed that $C_M$ is of a sufficiently high value for the removal of the charges to have little effect on the precharging potential $V_{AO}$ of capacitor $C_A$. The processing of a new sample of the input signal then begins.

In a filter CCD, the signal charge depending on time $Q_s(t)$ is always superimposed on a constant mean charge $Q_m$: $Q_e(t) = Q_s(t) + Q_m$ from which:

$$\Delta\phi_S^+ - \Delta\phi_S^- = Q_m \cdot \sum_{1}^{N} (h_k^+ - h_k^-) +$$

$$\sum_{1}^{N} (h_k^+ - h_k^-) \cdot Q_s(t-kT) \text{ with } |\phi_s(t)| \leq Q_m.$$

With the amplitude deviation of $Q_s(t)$ being always less than that of $Q_m$, the sign of $(\Delta\phi_S^+ - \Delta\phi_S^-)$ is then determined by that of $$\sum_{1}^{N} (h_k^+ - h_k^-).$$

When the sum of the coefficients is negative, $\Delta\phi_S^+$ is then less than $\Delta\phi_S^-$ and the arrival of charges under the positive storage electrodes is not sufficient to enable transistor $T_1$ (see FIG. 4e). In this case, the circuit 11 is used connected to point P. At time $t_3$, with signal $\phi_C$ at the high level, capacitor $C_O$ stores a charge $Q_O = C_O \cdot V_O$. At time $t_5$, the signal $\phi_L$ is at the high level and the quantity of charges $Q_O$ is transferred to point P by transistor $T_6$. The charge $Q_O$ allows $T_1$ to be enabled. The quantity of charges $Q_O + Q^+ - Q^-$ is transferred to point A, this quantity of charges must be positive, which is obtained by adjusting the constant potential $V_O$ or the capacitor $C_O$.

The filter of the invention removes the disturbance to the reading of the charges under the storage electrodes by the control signals, applied to the different electrodes, which exist in filters of the prior art. In the filter of the invention, the only control signal applied to the electrodes is the signal $\phi$.

$C_\phi$ designates the coupling capacity by overlapping of the electrodes driven by the signals $\phi$ and $V_P$.

At time $t_4$, signal $\phi$ goes to the high level and induces by coupling a potential rise equal to:

$(C_\phi/C_\phi + C_P) \cdot V_\phi$ which is added to $\Delta\phi_S^-$.

The potential of point P at time $t_4$ may then be written:

$$V_P(t_4) = V_{PO} - V_T + \frac{Q^-}{C_P} + \frac{C_\phi}{C_\phi + C_P} \cdot V_\phi$$

At time $t_5$, signal $\phi$ goes to the low level and induces at point P a decrease in potential equal to:
$-(C_\phi/C_\phi + C_P)$ which is added to $\Delta\phi_S^+$.

The potential of point P at time $t_5$ may then be written:

$$V_P(t_5) = V_P(t_4) - \left( \frac{Q^+}{C_P} + \frac{C_\phi}{C_\phi + C_P} \cdot V_\phi \right) =$$

$$V_{PO} - V_T - \frac{Q^+ - Q^-}{C_P}$$

It can then be seen that with the weighting coefficients of the filter being elaborated at two successive times, $t_4$ and $t_5$, before and after signal $\phi$ passes to the high level, the quantity of charges $Q^+ - Q^-$ which is removed by transistor $T_1$ so that point P again assumes the value $V_P = V_{PO} - V_T$ and which corresponds to the elaboration of a weighting coefficient, is independent of the coupling with signal $\phi$.

It is apparent that within the scope of the invention, modifications and different arrangements can be made other than are here disclosed. The present disclosure is merely illustrative with the invention comprehending all variations thereof.

What is claimed is:

1. A transversal charge transfer filter comprising a semiconductor substrate covered by an insulating layer on which transfer electrodes alternate with charge-storing electrodes, wherein one storage electrode out of two is cut into two parts and the weighting coefficients are elaborated by reading means connected at a point P to a part of each cut storage electrode, which read negatively the charges leaving a so-called negative cut storage electrode and positively the charges arriving under the next so-called positive cut storage electrode.

2. The filter as claimed in claim 1, wherein the transfer electrode—cut storage electrode pairs receive a substantially constant potential $V_P$ and the transfer electrode—whole storage electrode pairs receive a periodic voltage, of a period equal to half of the period for injecting charges into the filter, which ensures, at a given moment, the presence of charges under one cut storage electrode out of two of the filter.

3. The filter as claimed in claim 2, wherein the reading means comprise a first saturation-biased transistor connected to point P and a reading capacitor connected to this transistor, this transistor re-establishing the potential $V_P$ at point P, after the departure of the charges from the negative cut storage electrodes and the arrival of charges under the positive cut storage electrodes, by ensuring the removal under the reading capacitor of a quantity of charges corresponding to the weighting coefficients of the filter.

4. The filter as claimed in claim 3, wherein the reading means comprise a second transistor which re-establishes the potential $V_P$ at point P, after departure of the charges from the positive cut storage electrodes and the arrival of the charges under the negative cut storage electrodes.

5. The filter as claimed in claim 4, wherein the reading means comprise a third MOS transistor, connected to the common point of the first transistor and the reading capacitor, which ensures removal of the quantity of charges corresponding to the weighting coefficients of the filter.

6. The filter as claimed in claim 3, wherein with the sum of the weighting coefficients of the filter negative, the reading means ensure the injection of a constant quantity of charges under the first transistor, after the departure of the charges from the negative cut storage electrodes, thus enabling it when the charges arrive under the positive cut electrodes.

* * * * *